United States Patent
Gronheid et al.

(10) Patent No.: US 9,041,164 B2
(45) Date of Patent: May 26, 2015

(54) CONFORMAL ANTI-REFLECTIVE COATING

(71) Applicant: IMEC, Leuven (BE)

(72) Inventors: Roel Gronheid, Leuven (BE);
Christoph Adelmann, Leuven (BE);
Annelies Delabie, Leuven (BE); Gustaf Winroth, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/184,691

(22) Filed: Feb. 19, 2014

(65) Prior Publication Data

US 2014/0231968 A1    Aug. 21, 2014

(30) Foreign Application Priority Data

Feb. 20, 2013  (EP) .................................... 13156019

(51) Int. Cl.
*H01L 21/027* (2006.01)
*H01L 21/265* (2006.01)
*H01L 29/04* (2006.01)
*G03F 7/09* (2006.01)

(52) U.S. Cl.
CPC .............. *H01L 21/265* (2013.01); *H01L 29/04* (2013.01); *G03F 7/091* (2013.01)

(58) Field of Classification Search
CPC .................................................. H01L 21/0276
USPC ........... 148/33.3; 257/622, 626; 438/524, 525
See application file for complete search history.

(56) References Cited

U.S. PATENT DOCUMENTS

| 8,298,943 | B1 | 10/2012 | Arnold et al. |
| 2001/0021481 | A1 | 9/2001 | Sabnis et al. |
| 2002/0015910 | A1 | 2/2002 | Roberts et al. |
| 2003/0044726 | A1 | 3/2003 | Chen et al. |
| 2003/0054117 | A1 | 3/2003 | Sabnis et al. |
| 2004/0058278 | A1* | 3/2004 | Roberts et al. ................ 430/311 |
| 2004/0197527 | A1 | 10/2004 | Maula et al. |
| 2005/0266683 | A1* | 12/2005 | Lee .............................. 438/638 |

(Continued)

FOREIGN PATENT DOCUMENTS

| EP | 1035442 | 9/2000 |
| EP | 2048700 | 4/2009 |
| WO | 2005001901 | 1/2005 |

OTHER PUBLICATIONS

Search Report for European Patent Application Serial No. 13156019.5 (Aug. 19, 2013).

(Continued)

*Primary Examiner* — George Fourson, III
(74) *Attorney, Agent, or Firm* — McDonnell Boehnen Hulbert & Berghoff LLP

(57) ABSTRACT

In one aspect, a method is disclosed that includes providing a substrate having a topography that comprises a relief and providing an anti-reflective film conformally over the substrate using a molecular layer deposition step. The anti-reflective film may be formed of a compound selected from the group consisting of: (i) an organic compound chemically bound to an inorganic compound, where one of the organic compound and the inorganic compound is bound to the substrate and where the organic compound absorbs light at at least one wavelength selected in the range 150-500 nm, or (ii) a monodisperse organic compound absorbing light at at least one wavelength selected in the range 150-500 nm. The method further includes providing a photoresist layer on the anti-reflective film.

20 Claims, 6 Drawing Sheets

(56) References Cited

U.S. PATENT DOCUMENTS

2008/0102313 A1* 5/2008 Nilsen et al. .......... 428/704
2010/0178481 A1* 7/2010 George et al. .......... 428/213
2011/0256726 A1 10/2011 LaVoie et al.

OTHER PUBLICATIONS

Yoshimura et al., "Polymer Films Formed with Monolayer Growth Steps by Molecular Layer Deposition," Applied Physics Letters 59, 482 (Jul. 1991).

Dameron et al., "Molecular Layer Deposition of Alucone Polymer Films Using Trimethylaluminum and Ethylene Glycol," Chem. Mater., 20 (Apr. 2008).

Lee et al., "Alucone Alloys with Tunable Properties Using Alucone Molecular Layer Deposition and Al2O3 Atomic Layer Deposition," Journal of Physical Chemistry (Jan. 2012).

Yoon et al., "Molecular Layer Deposition of Hybrid Organic—Inorganic Alucone Polymer Films Using a Three-Step ABC Reaction Sequence," Chem. Mater., 21 (Nov. 2009).

* cited by examiner

CONFORMAL ANTI-REFLECTIVE COATING

CROSS-REFERENCE TO RELATED APPLICATION

This application claims priority to European Patent Application Serial No. EP 13156019.5 filed Feb. 20, 2013, the contents of which are hereby incorporated by reference.

BACKGROUND

In the fabrication of integrated circuits, continued scaling increases requirements on implant layers. Also, reduction of the substrate reflectivity as much as possible during photoresist exposure (e.g., to less than 1%) becomes critical for maintaining dimension control of submicron features. As a result, Bottom Anti-Reflective Coatings (BARCs) have become desirable for Critical Dimension (CD) control on topography. Current implant layers are patterned at 248 nm lithography. The problems will become more severe when 193 nm lithography is in use for this layer.

BARCs are typically deposited by spin-coating, followed by the providing of a photoresist, the exposition and development of the photoresist, and finally the removal of the BARC by dry etching. The formation of an implant layer is performed after etching of the BARC layer.

SUMMARY

A general problem with the use of BARCs is that the dry etching step needs to be relatively aggressive in order to remove the entirety of the BARC. As a result, not only is the BARC etched away but also the underlying topography is partially attacked. As a result, the underlying topography is etched as well, which is not desired. For instance, in a Fin-shaped Field Effect Transistor (FinFET) manufacture process, during the etching step, the top of the fins is etched before the BARC is entirely removed from the trenches (see FIG. 2).

Literature is currently considering the use of developable BARC in order to remove the need for dry etching. A developable BARC could in principle be removed during the resist development step. Such a developable BARC, however, typically suffers from a lack of compatibility with the overlying resist, a higher BARC development speed in areas having a denser topography (so-called iso-dense bias effects), and incomplete BARC development. These problems make this solution difficult and no product is yet available.

The person skilled in the art is therefore currently facing the dilemma of having either to implant ions on a substrate still partly covered with a BARC or to implant ions on a substrate which topology has been altered. There is therefore still a need in the art for a solution to the above stated problem.

The present disclosure relates to methods for forming an anti-reflective coating (ARC) layer on a substrate during an integrated circuit fabrication step, as well as the resulting integrated circuit structure. Beneficially, the present disclosure may allow for improved ion implanting during semiconductor manufacturing The inventors have realized that the problems from the prior art could be solved if the BARC layer could be made conformal and also relatively thin. A conformal BARC layer has a uniform thickness and tends to exactly follow the topography of the underlying substrate. Such a BARC layer would have the double advantage of being uniformly etchable and being uniform enough to permit implantation through BARC. By contrast, typical BARC is deposited by spin coating and is therefore non conformal, resulting in variation in implant dose as a function of BARC thickness. The method presented in embodiments of the present disclosure overcomes the problems of the prior art by providing a BARC layer of uniform thickness which can either be uniformly etched or through which a uniform implant can be performed.

The disclosed BARC layer can also be made relatively thin, thereby further facilitating the implantation of ions through the BARC.

In a first aspect, the present disclosure relates to a method for performing an integrated circuit flow step. The method may include providing a substrate having a topography that includes a relief and providing an anti-reflective film conformally over the substrate using a molecular layer deposition step. The anti-reflective film may be formed of a compound selected from the group consisting of: (i) an organic compound chemically bound to an inorganic compound, where one of the organic compound and the inorganic compound is bound to the substrate and where the organic compound absorbs light at at least one wavelength selected in the range 150-500 nm, or (ii) a monodisperse organic compound absorbing light at at least one wavelength selected in the range 150-500 nm. The method further includes providing a photoresist layer on the anti-reflective film.

The disclosed method may allow for preparation a stack of an anti-reflective film and a photoresist layer without the introduction of defects (such as, e.g., damaged substrate topography) in the structure under construction during subsequent flow steps (such as, e.g., ion implantation or etching). The conformal nature of the anti-reflective film provision is one of the factors that contributes to solve this problem. The nature of the molecular layer deposition (MLD) process, enabling monomolecular layer by layer deposition of an organic compound, is another factor that contributes to solve this problem due to the possibility of obtaining very low thickness conformal layers comprising an organic compound. The fact that the organic compound of the obtainable anti-reflective film absorbs light at at least one wavelength selected in the range 150-500 nm is yet another such factor, imparting adequate anti-reflective properties even at low layer thickness. These three factors work synergistically together to solve the above problem.

In some embodiments, an organic compound chemically bound to an inorganic compound may be present in the anti-reflective film. In these embodiments, providing the anti-reflective film may involve both at least an MLD step and an atomic layer deposition (ALD) step. For example, in these embodiments, providing the anti-reflective film may involve alternating ALD and MLD.

In some embodiments, first, one or more inorganic compound layer(s) may be deposited on the substrate by ALD and, second, one or more organic compounds may be deposited by MLD, thereby forming an organic compound layer. The first (or only) organic compound deposited in this MLD step may be reacted on the inorganic compound layer. The subsequent organic compound(s) may be reacted on the previous organic compound layer. Thereafter the deposition of inorganic compounds via ALD and organic compounds via MLD may be alternated until the desired thickness and refractive index is obtained.

In some embodiments, the step of providing the anti-reflective film may consist entirely in ALD and MLD cycles, or entirely in MLD cycles. In this manner, the conformality of the method may be ensured.

In some embodiments, the method may further include exposing the photoresist layer through a mask and developing the photoresist layer.

The uncovered anti-reflective film, due to its conformal nature, may avoid the introduction of defects (such as, e.g., damaged substrate topography) in the structure under construction during subsequent flow steps (such as, e.g., ion implantation or etching).

In some embodiments, the disclosed method may be used for implanting ions in a substrate. In these embodiments, the method may further include etching away said anti-reflective film, and implanting ions into the substrate.

In some embodiments, the step of etching of the anti-reflective film may be omitted, and the ions may be implanted into the substrate through the anti-reflective film. Such omission may have the advantage of saving one process step. Furthermore, because the etching of the anti-reflective film may, in some instances, have the potential to be dangerous to the integrity of the topography, the omission may have the advantage of being topography-friendly. Because the anti-reflective film is conformal, homogeneous ion implanting through it is possible.

In other embodiments, the etching of the anti-reflective film may be performed before ion implanting. Such etching may have the advantage that the etching is topography-friendly since the anti-reflective layer tends to etch everywhere homogeneously due to the layer's conformality. As a result, the ion implanting can be performed on a substrate free of anti-reflective layer (thereby assuring homogeneity of the implanting) and of topography presenting low or no damage.

In a second aspect, a structure is disclosed that includes a substrate having a topography that includes a relief and an anti-reflective film that conformally overlays the substrate. The anti-reflective film may be formed of a compound selected from the group consisting of: (i) an organic compound chemically bound to an inorganic compound, where one of the organic compound and the inorganic compound is bound to the substrate and where the organic compound absorbs light at at least one wavelength selected in the range 150-500 nm, or (ii) a monodisperse organic compound absorbing light at at least one wavelength selected in the range 150-500 nm. The structure further includes a photoresist layer formed on the anti-reflective film.

This structure may typically exist before an ion implantation step.

In a third aspect, a structure is disclosed that includes a substrate implanted with ions, where the substrate has a topography that includes a relief. The structure further includes and an anti-reflective film implanted with ions that conformally overlays the substrate. The anti-reflective film may be formed of a compound selected from the group consisting of: (i) an organic compound chemically bound to an inorganic compound, where one of the organic compound and the inorganic compound is bound to the substrate and where the organic compound is configured to absorb light at at least one wavelength selected in the range 150-500 nm, or (ii) a monodisperse organic compound configured to absorb light at at least one wavelength selected in the range 150-500 nm. The structure further includes a photoresist layer formed on the anti-reflective film.

This structure may typically exist after an ion implantation step.

As noted above, the organic compound may absorb light at at least one wavelength selected in the range 150-500 nm. Alternatively, in some embodiments, the organic compound may have at least one absorption band overlapping with the range.

In some embodiments, the range may be, for example, from 190-250 nm, or at 193 or 248 nm. The absorption coefficient k may be, for example, at least 0.02, at least 0.05, or at least 0.1 at the at least one wavelength or for the absorption band.

The structures of the second and third aspects may be formed during the course of an integrated circuit manufacturing process such as the one described in the first aspect of the present disclosure.

In some embodiments, the substrate may be or may include a semiconductor material. For example, in some embodiments, the substrate may be a silicon wafer or a germanium wafer. In some embodiments, the substrate (e.g., having a topography presenting a relief) may have a hydrophilic surface. The hydrophilic nature of the surface may, for example, be imparted by hydroxyl groups. The topography presenting a relief can be any non-flat surface. Examples are topographies presenting one or more depressions (e.g., vias, trenches, holes, etc.) and/or one or more protrusions (e.g., fins).

In some embodiments, the anti-reflective film may have a thickness less than 45 nm, less than 30 nm, or less than 25 nm. Such a low thickness may allow for a soft complete etching of the film in a limited amount of time. Further, such a low thickness may allow some subsequent steps to be performed without removing the anti-reflective film. For instance, such low thicknesses may enable ion implantation of the substrate through the anti-reflective film. It is an advantage of embodiments of the method of the first aspect of the present disclosure that such a low thickness can be achieved while simultaneously assuring the anti-reflective properties and assuring conformality.

In some embodiments, the anti-reflective film may absorb at least 90% of light at at least one wavelength selected in the range 150-500 nm, or the range 190-250 nm, or at 193 nm or 248 nm. This is advantageous since it is in this range of wavelength that mask development is operated. Currently, 248 nm light is actually used. The next technology node will use 193 nm. Good anti-reflection properties are important for maintaining dimension control of submicron features.

In some embodiments, the anti-reflective film may have ions implanted therein. Examples of ions that can be implanted are ions of arsenic, boron, and phosphorus but also of other elements such as oxygen or hydrogen. For the product, only boron, phosphorous and arsenic ions will be easily detectable.

The ion concentration in the anti-reflective film may, for instance, be within the range $10^{20}$ ions/cm$^3$ to $10^{21}$ ions/cm$^3$.

An anti-reflective film having ions implanted therein is a signature that a method according some embodiments of the present disclosure has been used. This is especially so if the same ions are found in both the anti-reflective film and the substrate. A structure having such an implanted anti-reflective film is an intermediate structure in a semi-conductor process involving embodiments of the method of the present disclosure.

In some embodiments, the anti-reflective film may have a k value of at least 0.02, at least 0.05, or at least 0.1 at at least one wavelength selected in the range 150-500 nm, in the range 190-250 nm, or at 193 nm or 248 nm. The k value is the imaginary part of the refractive index. It indicates the amount of absorption loss when the electromagnetic wave propagates through the material.

In some embodiments, the real part of the refractive index n may be from 1.2 to 2.0 or from 1.3 to 1.6.

In some embodiments, the anti-reflective film may conformally overlay the substrate. In other words, the thickness of the anti-reflective film may be the same on the relief structures and in the recesses between such structures as well as on the sides of such relief structures. In some embodiments, the thickness uniformity of the anti-reflective coating may be characterized by a relative standard deviation of less than 2%, less than 1%, or less than 0.5%.

In some embodiments, the anti-reflective film conformally overlaying the substrate may include an organic compound chemically bound to an inorganic compound. The organic compound or the inorganic compound may be bound to the substrate. The organic compound may absorb light at at least one wavelength selected in the range 150-500 nm.

The organic compound chemically bound to an inorganic may be monodisperse. This may ensure a smoother film of more uniform thickness, thereby providing better optical properties.

The organic compound may be provided by reacting an organic compound precursor with the inorganic compound. The organic compound may be the reaction product of more than one organic precursor with each other, where one of them is reacted with the inorganic compound. The organic compound precursors may have at least two reactive substituents selected from the group consisting of —OH, —OR, —O, —COOH and derivatives (e.g. —COCl, carboxylic anhydrides (which count for two —COOH) or esters), —SH, —$SO_4H$, —$SO_3H$, —$PH_2$, —$PO_4H$, —$PO_3H$, —PRH, —$NH_3I$, —SeH, —$SeO_3H$, —$SeO_4H$, —TeH, —$AsH_2$, —AsRH, —$SiH_3$, —$SiRH_2$, —SiRR'H, —$GeH_3$, —$GeRH_2$, —GeRR'H, amines (e.g. -$NH_2$ or alkyl amines), silated amine, halogenated amine, imide, azide and nitroxyl, where the group R and R' are independently selected among a $C_{1-10}$ aryl, alkyl, cycloalkyl, alkenyl or alkynyl group. In some embodiments, the reactive groups may be —OH, —COOH and derivatives, and amines (in particular —$NH_2$). Both reactive substituents may be different or the same.

In some embodiments, the organic compound may absorb light at at least one wavelength selected in the range 150-500 nm. For this purpose, the organic compound may include at least one aromatic ring (e.g., a mono-cyclic aromatic group, a poly-cyclic aromatic group or a heterocyclic aromatic group). Non-aromatic compounds (e.g., EG) can be used as well, but the air stability of hybrids obtained with aromatic compounds (e.g., alucones obtained from TMA/Aromatic compound) tends to be better.

In some embodiments, the organic compound optionally may include other substituents than the at least two reactive substituents.

The organic compound precursor may be brought into the gas phase. For this purpose, its boiling point or its sublimation point may be lower than its decomposition point at at least one pressure and in inert atmosphere.

In some embodiments, the reactive precursor may be homofunctional, i.e., all its reactive substituents may be identical. This may help avoiding reaction of the precursor with itself. In some embodiments, the reactive precursor may be heterofunctional (e.g., aminophenol). This may help avoiding that all (e.g., both) functional groups react on the surface (double reaction) which result in termination of growth. In some embodiments, the reactive precursor may be bifunctional, i.e., it may have two reactive substituents. In some embodiments, the reactive precursor may be tri- or tetra functional. This, in some embodiments, may help with conformality. In some embodiments, the reactive precursor may be an homobifunctional precursor, i.e., it has exactly two identical functional groups.

Examples of useful organic compound precursors are ethylene glycol, p-terephthalic acid, hydroquinone, aminophenol, phenylene diamine, p-terephthaloyl chloride, phthalic anhydride, and p-Naphthohydroquinone.

In some embodiments, the organic compound may be bound to the inorganic compound through a bridging group selected from the group consisting of —O—, —NR—, —$SO_4$—, —$SO_3$—, —C(O)O—, —C(O)NR—, and —$PO_4$— where R is selected among H, $C_{1-10}$ aryl, alkyl, cycloalkyl, alkenyl and alkynyl group.

In some embodiments, the anti-reflective film conformally overlaying the substrate may include a monodisperse organic compound absorbing light at at least one wavelength selected in the range 150-500 nm.

In some embodiments, the organic compound and the inorganic compound may form together a metal alkoxide such as an aluminium alkoxide or a metal carboxylate. The use of a metal alkoxide may be advantageous because it may assure a good bondage of the anti-reflective layer with the substrate. Metal carboxylates may present the advantage of a better air stability than metal alkoxides.

In some embodiments, the organic compound may be formed from precursors suitable for step growth polymerization. For instance, the organic compound may be an oligomer or polymer (homo- or co-) obtainable by step growth polymerization. This may be advantageous because oligomers and polymers obtainable by step growth polymerization can be deposited by MLD in a controlled monomeric layer by monomeric layer fashion. This may allow for obtaining organic films composed of monodispersed oligomers or polymers and therefore having an excellent control over the thickness and the chemical composition of the layer. In some embodiments, the organic compound may be obtained by the alternating MLD deposition of a first monomer and a second monomer. In some embodiments, the first monomer may be such that it reacts with the substrate or an inorganic compound previously deposited on the substrate rather than with itself in the MLD conditions. The second monomer may be such that it reacts with the first monomer rather than with itself in the MLD conditions. In some embodiments, the first monomer can be a homobifunctional monomer having two identical functional groups able to react with a functional group of the second monomer. In some embodiments, the second monomer can be a homobifunctional monomer having two identical functional groups able to react with the functional groups of the first monomer. In some embodiments, at least one of the first and second monomers may be able to react with a functional group of either the substrate or an inorganic compound present on the substrate. An example of first monomer is ethylene glycol. Ethylene glycol has two hydroxyl groups. An example of second monomer is terephthaloyl chloride. Therephthaloyl chloride has two acid chloride groups. Hydroxyl groups can form esters by reacting with acid chloride groups. Hydroxyl groups can also react with the methyl aluminium species present on a substrate previously treated by trimethylaluminium.

Examples of suitable first monomers are homobifunctional monomers having reactive groups able to react with the reactive groups of the second monomer.

In some embodiments, the oligomer or polymer may be selected from polyesters, polyamides, polyurethanes, polyimides, polycarbonates, polyurea, polythiourea, and polythiolene.

The following is a non-exclusive list of examples of organic precursors that can be used to for the organic compound: ethylene glycol, p-Terephthalic acid, hydroquinone, aminophenol, phenylene diamine, p-Terephthaloyl chloride, phthalic anhydride, and p-Naphthohydroquinone.

In some embodiments, the inorganic compound precursor may be selected from a group consisting of metal alkyls, metal cycloalkyls, metal aryls, metal amine, metal silylamine, metal halogenides, metal carbonyls and metal chelates, where the metal is selected from the group consisting of Al, Si, Ge, Sn, In, Pb, alkali metals, alkaline earth metals, 3d-insertion metals, 4d-insertion metals, 5d-insertion metals, lanthanides and actinides. Example metals are Al, Zn, Zr, Hf, Sn, In, Ti, V, and Mn. Examples of inorganic compound precursors are TMA, diethylzinc, zirconium tetra-tert-butoxide, Tetrakis(dimethylamido)hafnium, Bis(ethylcyclopentadienyl)magnesium, Tetradimethylaminotin, Trimethylindium, Tetradimethylaminotitanium, Bis(ethylcyclopentadienyl)vanadium, and Bis(ethylcyclopentadienyl)manganese.

In a fourth aspect, the present disclosure relates to an integrated circuit comprising a structure according to any embodiment of the second aspect or third aspect of the present disclosure.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DETAILED DESCRIPTION

Figure 1:
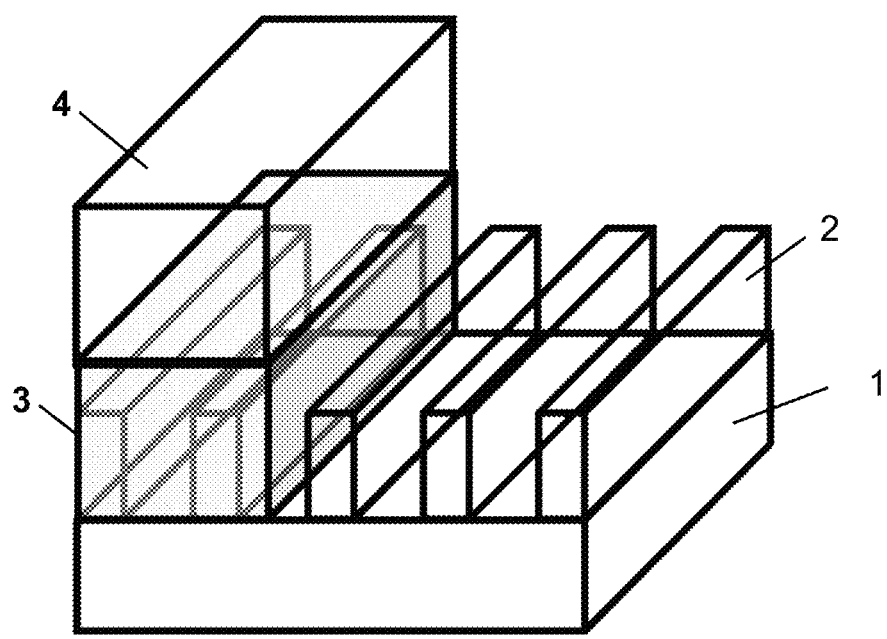
FIG. 1 is a schematic representation of a perspective view of a structure for an ion implantation method according to the prior art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "Molecular Layer Deposition" or "MLD" refers to an organic or hybrid thin film deposition technique that is based on the sequential use of a gas phase chemical process. Typically, MLD reactions use two organic chemicals, usually called precursors. These precursors react with a surface one at a time in a sequential, self-limiting, manner. An excess of precursor is applied in order to saturate the whole surface. Each time, between the chemisorption reactions, the reactor is purged or pumped down by an inert gas in order to remove reaction by-products and non-reacted precursor so that the film grows only by means of surface reactions. By exposing the precursors to the growth surface repeatedly, a thin organic film is deposited As used herein and unless provided otherwise, the term "Atomic Layer Deposition" or "ALD" refers to an inorganic thin film deposition technique that is based on the sequential use of a gas phase chemical process. Typically, ALD reactions use two chemicals, usually called precursors. These precursors react with a surface one at a time in a sequential, self-limiting, manner. An excess of precursor is applied in order to saturate the whole surface. Each time, between the chemisorption reactions, the reactor is purged or pumped down by an inert gas in order to remove reaction by-products and non-reacted precursor so that the film grows only by means of surface reactions. By exposing the precursors to the growth surface repeatedly, a thin inorganic film is deposited In any embodiment of any aspect of the present disclosure, when an element absorbing light at at least one wavelength selected in the range 150-500 nm is mentioned, this may be understood to refer to embodiments relating to an element having at least one absorption band overlapping with the range 150-500 nm.

Similarly, in any embodiment of any aspect of the present disclosure, when a range 150-500 nm is mentioned, this may be understood to refer to embodiments relating to a range 190-250 nm, or to the specific values of 193 nm and/or 248 nm.

The disclosure will now be described by a detailed description of several embodiments of the disclosure.

Reference will be made to transistors. These are three-terminal devices having a first main electrode such as a drain, a second main electrode such as a source and a control electrode such as a gate for controlling the flow of electrical charges between the first and second main electrodes.

It will be clear for a person skilled in the art that the present disclosure is also applicable to similar devices that can be configured in any transistor technology, including for example, but not limited thereto, CMOS, BICMOS, Bipolar and SiGe BICMOS technology.

It is to be understood that although embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

FIG. 1 shows a schematic perspective view of a structure of the prior art where a silicon substrate (1) presents a protruding relief (2). The relief is for instance the fins of a FinFET device. A BARC (3) is provided non conformally on the substrate (1) and a photoresist (4) is provided over said BARC (3).

Figure 6:
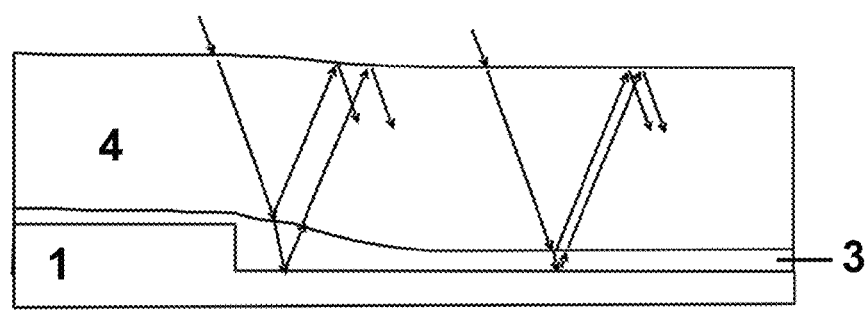
FIG. 6 is a schematic representation of a bottom anti-reflective coating/resist stack according to the prior art.

FIG. 6 shows a schematic cross-sectional view of a BARC (3)/resist (4) stack according to the prior art. A substrate (1) is provided and a relief is present in the substrate (1) (shown as a step on the left-side of the substrate (1)). The BARC layer (3) (provided by spin-coating) (3) is shown to be thicker at the level of the transition between the two substrate (1) levels defined by the step. A resist (4) is depicted on top of said BARC layer (3). Two light beams are depicted hitting the resist layer, one on the left side and one on the right side of the resist (4). As shown, the light beams are reflected differently at the resist/BARC and at the BARC/substrate interface, due to the difference in BARC thickness encountered by each beam.

Figure 2A:
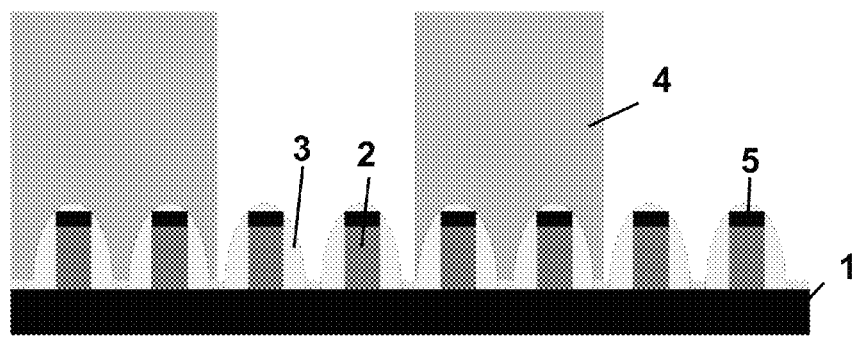
FIG. 2A is a schematic representation of a cross-section of a structure comprising a non-conformal BARC according to the prior art.
Figure 2B:
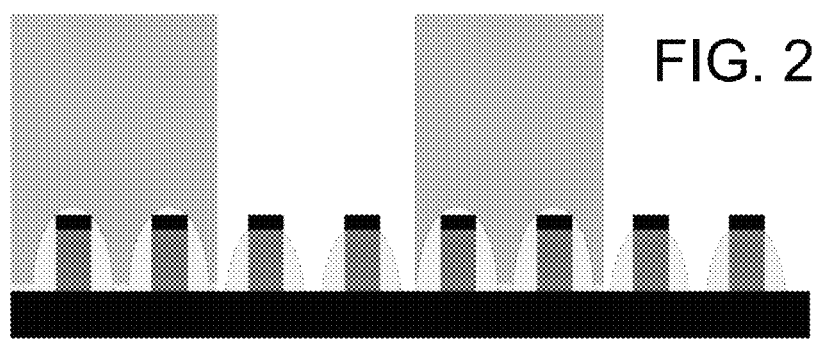
FIG. 2B depicts the partial result of a BARC clearing step where BARC is first cleared on top of the lines.
Figure 2C:
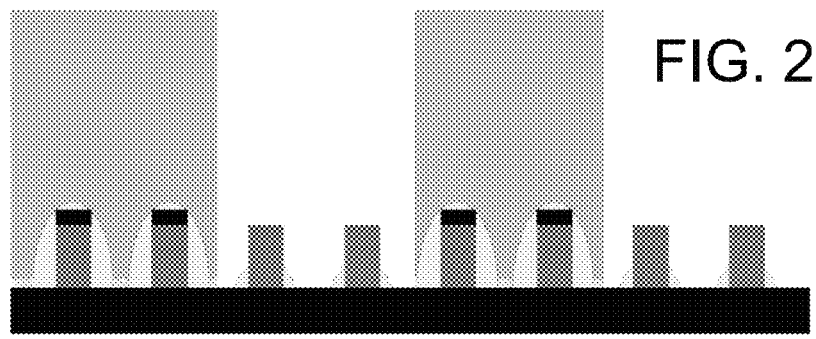
FIG. 2C depicts the final result of the BARC clearing step where the oxide is etched away before BARC is cleared in the trenches.

FIG. 2A is a schematic cross-sectional view of a BARC (3) clearing process according to the prior art. As shown, the BARC (3) is coated non-conformally through the spin coating of a liquid solution on top of the substrate (1). The substrate (1) present a relief (2) representing lines (2) separated by trenches. An oxide (5) is represented on top of the lines (2). Second, the BARC (3) is shown to be cleared first on top of the lines (2). Third, even before that the BARC (3) is cleared in the trenches, the oxide (5) is etched away. The relief (2) is therefore damaged during this prior art process.

Figure 3:
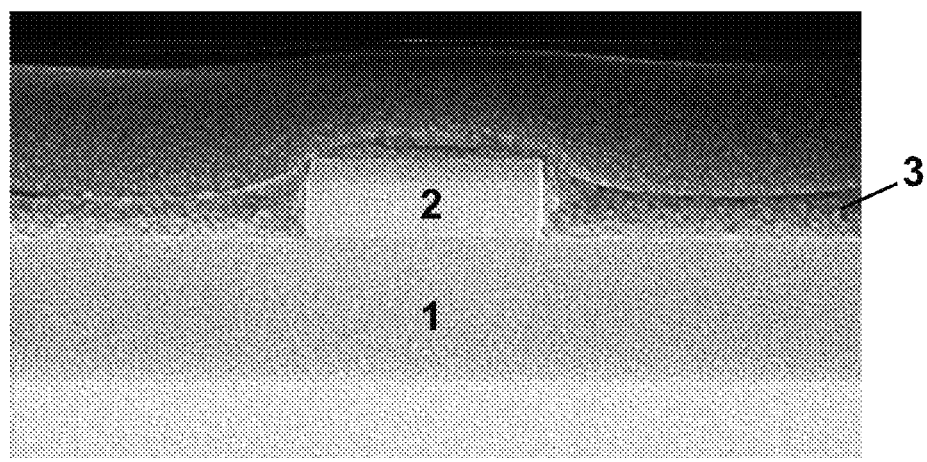
FIG. 3 is an electron micrograph of a BARC coating according to the prior art.

The electron micrograph of FIG. 3 shows a semiconductor substrate (1) presenting a relief (2) on top of which a non-conformal BARC (3) is present. The micrograph clearly shows that the thickness of the coating is different outside of the relief (2), on top of the relief (2) and at the edges of the relief (2).

Figure 4:
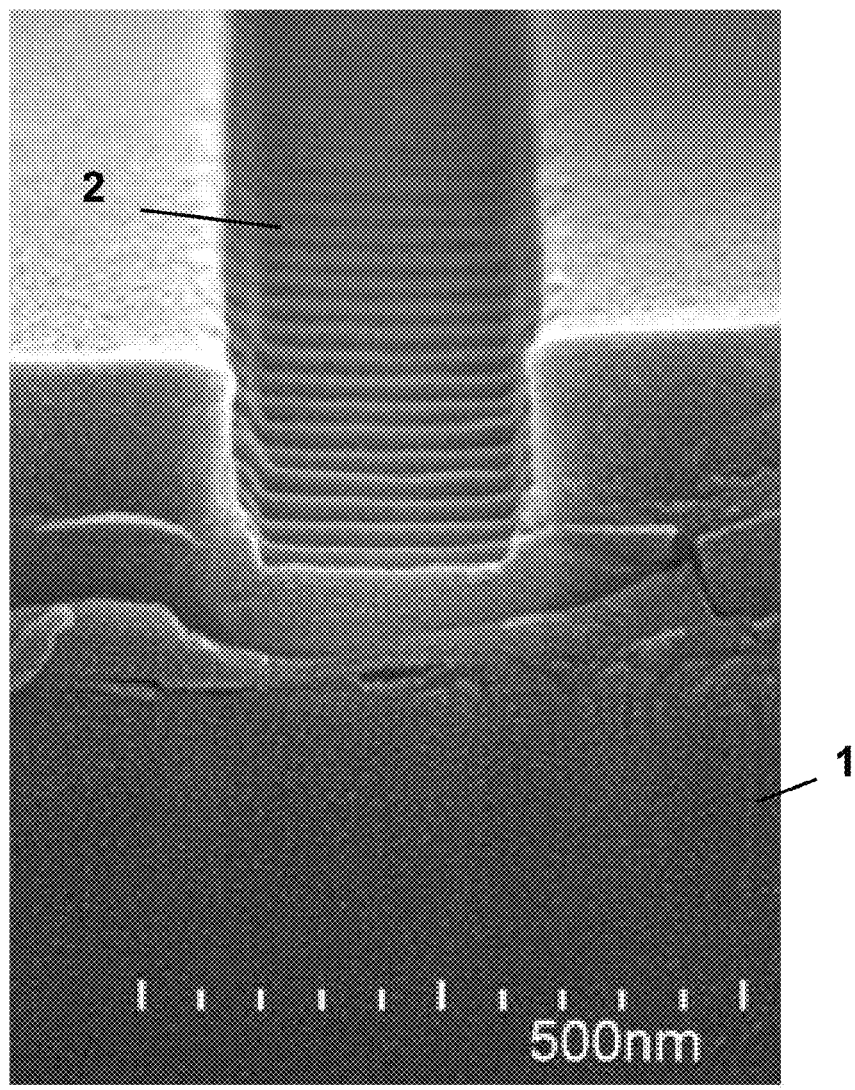
FIG. 4 is an electron micrograph of a damaged topography resulting from a method for performing an integrated circuit flow step according to the prior art.

The electron micrograph of FIG. 4 shows a semiconductor substrate (1) presenting a relief (2). Both the substrate around the relief and the bottom of the relief is seen to be damaged as the result of an aggressive BARC etching step as necessary in the prior art.

Figure 5A:
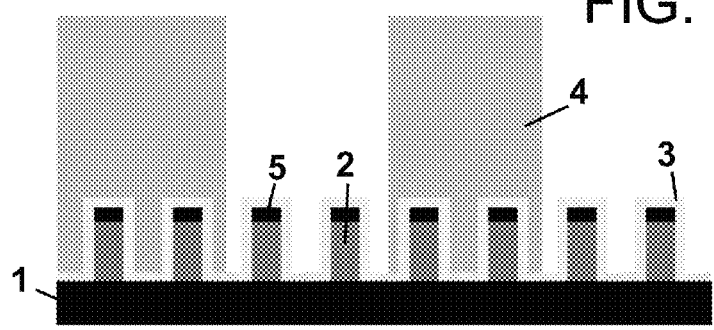
FIGS. 5A-B are a schematic representation of a method according to an aspect of the present disclosure.
Figure 5B:
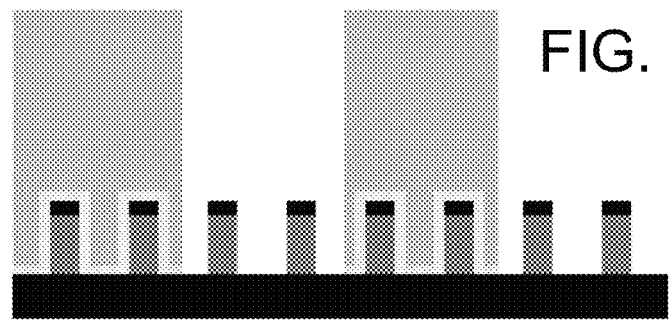

FIG. 5 is a schematic cross-sectional view of a BARC (3) clearing process according to an embodiment of the present disclosure. First, an anti-reflective film (3) is conformally provided on top of a substrate (1) presenting a relief (2). Second, a timed etch enables the clearing of the anti-reflective film (3) at the same time on top of the relief (lines 2) and in the trenches between the lines.

EXAMPLE 1

Implanting of Boron Ions in a Si Substrate with Provision and Etching of an Anti-Reflective Hybrid Film Obtained by Using Trimethylaluminium and Ethylene Glycol as Precursors A Si hydrophilic substrate is provided in an ALD reactor. The temperature of the substrate is set at a temperature in the range 85-175° C. In a first step, trimethylaluminium (TMA) is reacted with said substrate in an ALD step, thereby providing a layer of aluminium species on said substrate. In a second step, ethylene glycol (EG) is reacted with said aluminium species in a MLD step, thereby providing a layer of an organic compound on the layer of aluminium species. The first and second steps are alternated, until a density of 1.5 g/cm³ of a TMA:EG (1:1) anti-reflective material is obtained on the substrate. A positive photoresist layer is provided on the anti-reflective material. A mask is used to selectively expose the photoresist layer to light at 193 nm. The photoresist is then developed, which leads to the removal of the exposed areas. The resulting pattern in the resist after development acts as a barrier against ion implantation. The anti-reflective film is etched away either through a dry oxygen plasma or via a wet process. Boron ions are implanted in the substrate.

EXAMPLE 2

Implanting of Boron Ions in a Si Substrate Through and Anti-Reflective Film Obtained by Using Trimethylaluminium and Ethylene Glycol as Precursors Example 1 is repeated except that the anti-reflective film is not etched away and that boron ions are implanted in the substrate through the anti-reflective film.

EXAMPLE 3

Implanting of Boron Ions in a Si Substrate Through an Anti-Reflective Film Obtained by Using Trimethylaluminium/Water and Trimethylaluminium/Ethylene Glycol Cycles in a (1:1) Ratio A Si hydrophilic substrate is provided in an ALD reactor. The temperature of the substrate is set at 135° C. In a first step, trimethylaluminium (TMA) is reacted with said substrate in a first sub-step of an ALD cycle, thereby providing a layer of aluminium species on said substrate, then said layer of aluminium species is reacted with water in a second sub-step of said ALD cycle, thereby providing hydroxyl functions on said aluminium species. In a second step, trimethylaluminium (TMA) is reacted with said hydroxyl functions in a first sub-step of a mixed ALD-MLD cycle, then ethylene glycol (EG) is reacted with said aluminium species in a second sub-step of said mixed ALD-MLD cycle, thereby providing a layer of an organic compound on the layer of aluminium species. The first and second steps are alternated, until a density of 1.5 to 3 g/cm³ of a anti-reflective material having a refractive index of 1.54 at 633 nm is obtained on the substrate. A positive photoresist layer is provided on the anti-reflective material. A mask is used to selectively expose the photoresist layer to light at 193 nm. The photoresist is then developed, which leads to the removal of the exposed areas. The resulting pattern in the resist after development acts as a barrier against ion implantation. The anti-reflective film is not etched. Boron ions are implanted, through the anti-reflective film, in the substrate.

EXAMPLE 4

Implanting of Boron Ions in a Si Substrate Through an Anti-Reflective Film Obtained by Using Trimethylaluminium/Water and Trimethylaluminium/Ethylene Glycol Cycles in a (1:3) Ratio Example 3 is repeated except that the second step is performed 3 times successively before to perform the first step again. The sequence second step (3×), first step (1×) is repeated until a density of 1.5 to 3 g/cm³ of an anti-reflective material having a refractive index of 1.49 at 633 nm is obtained on the substrate.

EXAMPLE 5

Implanting of Boron Ions in a Si Substrate Through an Anti-Reflective Film Obtained by Using Trimethylaluminium/Water and Trimethylaluminium/Ethylene Glycol Cycles in a (3:1) Ratio Example 3 is repeated except that the first step is performed 3 times successively before to perform the second step. The sequence first step (3×), second step (1×) is repeated until a density of 1.5 to 3 g/cm³ of an anti-reflective material having a refractive index of 1.57 at 633 nm is obtained on the substrate.

EXAMPLE 6

Implanting of Boron Ions in a Si Substrate Through an Organic Anti-Reflective Film A Si hydrophilic substrate is provided in an ALD reactor. The temperature of the substrate is set at a temperature of from 145 to 175° C. In a first step, terephthaloyl chloride (TC) is reacted with said substrate in an MLD step, thereby providing a layer of a first organic compound on said substrate. In a second step, ethylene glycol (EG) is reacted with said layer of a first organic compound in a MLD step, thereby providing a layer of a second organic compound on the layer of a first organic compound. The first and second steps are alternated, until an anti-reflective material having a selected refractive index in the range 1.3-1.6 at a wavelength of 193 nm is obtained on the substrate. A positive photoresist layer is provided on the anti-reflective material. A mask is used to selectively expose the photoresist layer to light at 193 nm. The photoresist is then developed, which leads to the removal of the exposed areas. The resulting pattern in the resist after development acts as a barrier against ion implantation. The anti-reflective film is etched away by dry etching. Boron ions are implanted in the substrate.

EXAMPLE 7

Implanting of Boron Ions in a Si Substrate with Provision and Optional Etching of an Anti-Reflective Hybrid Film Obtained by Using Trimethylaluminium, Water, Terephthaloyl Chloride, and Ethylene Glycol as Precursors A Si hydrophilic substrate is provided in an ALD reactor. The temperature of the substrate is set at a temperature of from 145 to 175° C. In a first step, trimethylaluminium (TMA) is reacted with said substrate in a first sub-step of an ALD cycle, thereby providing a layer of aluminium species on said substrate, then said layer of aluminium species is reacted with water in a second sub-step of said ALD cycle, thereby providing hydroxyl functions on said aluminium species. In a second step, terephthaloyl chloride (TC) is reacted with said substrate in a first sub-step of an MLD cycle, thereby providing a layer of a first organic compound on said substrate. In a second sub-step of an MLD cycle, ethylene glycol (EG) is reacted with said layer of a first organic compound in a MLD step, thereby providing a layer of a second organic compound on the layer of a first organic compound. The first (TMA/H$_2$O via ALD) and second (TC/EG via MLD)

steps are alternated, until an anti-reflective material having a selected refractive index in the range 1.3-1.6 at a selected wavelength of 193 nm is obtained on the substrate. A positive photoresist layer is provided on the anti-reflective material. A mask is used to selectively expose the photoresist layer to light at 193 nm. The photoresist is then developed, which leads to the removal of the exposed areas. The resulting pattern in the resist after development acts as a barrier against ion implantation. The antrireflective film is not etched away. Boron ions are implanted in the substrate through the anti-reflective film.

EXAMPLES 8.1 AND 8.2

Implanting of Boron Ions in a Si Substrate with Provision and Optional Etching of an Anti-Reflective Hybrid Film Obtained by Using Trimethylaluminium, Water, Terephthaloyl Chloride, and an Aromatic Diol as Precursors Example 7 is repeated except that EG is replaced by hydroquinone (8.1) or p-naphthohydroquinone (8.2).

EXAMPLE 9

Implanting of Boron Ions in a Si Substrate with Provision and Optional Etching of an Anti-Reflective Hybrid Film Obtained by Using Trimethylaluminium, Water, Terephthaloyl Chloride, and an Aromatic Diamine as Precursors Example 7 is repeated except that EG is replaced by phenylene diamine.

EXAMPLE 10

Implanting of Boron Ions in a Si Substrate Through an Anti-Reflective Film Obtained by Using Trimethylaluminium/Water and Trimethylaluminium/Hydroquinone Cycles in a (1:1) Ratio Example 3 is repeated except that EG is replaced by hydroquinone.

EXAMPLE 11

Implanting of Boron Ions in a Si Substrate Through an Anti-Reflective Film Obtained by Using Trimethylaluminium/Water and Trimethylaluminium/Terephthalic Acid Cycles in a (1:1) Ratio Example 3 is repeated except that EG is replaced by terephthalic acid.

EXAMPLE 12

Implanting of Boron Ions in a Si Substrate Through an Anti-Reflective Film Obtained by Using Trimethylaluminium/Water and an Inorganic Precursor/Ethylene Glycol Cycles in a (1:1) Ratio Example 3 is repeated except that an inorganic precursor selected from diethylzinc, zirconium tetra-tert-butoxide, Tetrakis(dimethylamido) hafnium, Bis(ethylcyclopentadienyl) magnesium, Tetradimethylaminotin, Trimethylindium, Tetradimethylaminotitanium, Bis(ethylcyclopentadienyl) vanadium, and Bis(ethylcyclopentadienyl)manganese is used instead of TMA.

EXAMPLE 13

Implanting of Boron Ions in a Si Substrate with Provision and Etching of an Anti-Reflective Hybrid Film Obtained by Using Trimethylaluminium and Terephthaloyl Chloride as Precursors Example 1 is repeated except that EG is replaced by terephthaloyl chloride.

EXAMPLE 14

Implanting of Boron Ions in a Si Substrate Through an Anti-Reflective Film Obtained by Using Trimethylaluminium/Water and Trimethylaluminium/Terephthaloyl Chloride Cycles in a (1:1) Ratio Example 3 is repeated except that EG is replaced by terephthaloyl chloride.

EXAMPLE 15

Implanting of Boron Ions in a Si Substrate with Provision and Optional Etching of an Anti-Reflective Hybrid Film Obtained by Using Trimethylaluminium, Water, and Terephthaloyl Chloride as Precursors Example 7 is repeated except that EG is replaced by water.

The invention claimed is:

1. A structure comprising:
a substrate having a topography that comprises a relief;
an anti-reflective film that conformally overlays the substrate, wherein the anti-reflective film is formed of a compound selected from the group consisting of: (i) an organic compound chemically bound to an inorganic compound, wherein one of the organic compound and the inorganic compound is bound to the substrate and wherein the organic compound absorbs light at at least one wavelength selected in the range 150-500 nm, or (ii) a monodisperse organic compound absorbing light at at least one wavelength selected in the range 150-500 nm; and
a photoresist layer formed on the anti-reflective film.

2. The structure of claim 1, further comprising ions implanted in the anti-reflective film.

3. A structure comprising:
a substrate implanted with ions, wherein the substrate has a topography that comprises a relief;
an anti-reflective film implanted with ions, wherein the anti-reflective film conformally overlays the substrate, and wherein the anti-reflective film is formed of a compound selected from the group consisting of: (i) an organic compound chemically bound to an inorganic compound, wherein one of the organic compound and the inorganic compound is bound to the substrate and wherein the organic compound is configured to absorb light at at least one wavelength selected in the range 150-500 nm, and (ii) a monodisperse organic compound configured to absorb light at at least one wavelength selected in the range 150-500 nm; and
a photoresist layer formed on the anti-reflective film.

4. The structure of claim 3, wherein the anti-reflective film has a thickness less than 45 nm.

5. The structure of claim 3, wherein the anti-reflective film has a thickness less than 30 nm.

6. The structure of claim 3, wherein the anti-reflective film has a thickness less than 25 nm.

7. The structure of claim 3, wherein the organic compound and the inorganic compound together form a metal alkoxide.

8. The structure of claim 7, wherein the metal alkoxide is selected from the group consisting of (i) an aluminium alkoxide and (ii) a metal carboxylate.

9. The structure of claim 3, wherein being configured to absorb light at at least one wavelength selected in the range 150-500 nm comprises being configured to absorb at least 90% of light at at least one wavelength selected in the range 150-500 nm.

10. The structure of claim 3, wherein being configured to absorb light at at least one wavelength selected in the range 150-500 nm comprises being configured to absorb at least 90% of light at at least one wavelength selected in the range 190-250 nm.

11. The structure of claim 3, wherein being configured to absorb light at at least one wavelength selected in the range 150-500 nm comprises being configured to absorb at least 90% of light at at least one of 193 nm and 248 nm.

12. The structure of claim 3, wherein the anti-reflective film has an absorption coefficient k value of at least about 0.1 at at least one wavelength selected in the range 150-500 nm.

13. The structure of claim 3, wherein the anti-reflective film has an absorption coefficient k value of at least about 0.1 at at least one wavelength selected in the range 190-250 nm.

14. The structure of claim 3, wherein the anti-reflective film has an absorption coefficient k value of at least about 0.1 at at least one of 193 nm and 248 nm.

15. The structure of claim 3, wherein the organic compound comprises one of an oligomer and a polymer obtainable by step growth polymerization.

16. The structure of claim 3, wherein the organic compound is selected from the group consisting of polyesters, polyamides, polyurethanes, polyimides, polycarbonates, and polyurea.

17. A method comprising:
providing a substrate having a topography that comprises a relief;
providing an anti-reflective film conformally over the substrate using a molecular layer deposition step, wherein the anti-reflective film is formed of a compound selected from the group consisting of: (i) an organic compound chemically bound to an inorganic compound, wherein one of the organic compound and the inorganic compound is bound to the substrate and wherein the organic compound absorbs light at at least one wavelength selected in the range 150-500 nm, or (ii) a monodisperse organic compound absorbing light at at least one wavelength selected in the range 150-500 nm; and
providing a photoresist layer on the anti-reflective film.

18. The method of claim 17, further comprising:
exposing the photoresist layer through a mask; and
developing the photoresist layer.

19. The method of claim 17, further comprising:
etching away the anti-reflective film; and
implanting ions into the substrate.

20. The method of claim 17, further comprising implanting ions into the substrate through the anti-reflective film.

* * * * *